United States Patent
Fujisawa

(10) Patent No.: US 7,630,275 B2
(45) Date of Patent: Dec. 8, 2009

(54) LATENCY COUNTER

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 60 days.

(21) Appl. No.: 11/882,801

(22) Filed: Aug. 6, 2007

(65) Prior Publication Data

US 2008/0043566 A1    Feb. 21, 2008

(30) Foreign Application Priority Data

Aug. 21, 2006   (JP) ............................. 2006-224575

(51) Int. Cl.
    *G11C 8/00* (2006.01)
(52) U.S. Cl. .................. 365/233; 365/236; 365/189.07
(58) Field of Classification Search ................. 365/233, 365/236, 189.07, 189.05, 191, 230.08, 230.06, 365/189.12
    See application file for complete search history.

(56) References Cited

U.S. PATENT DOCUMENTS

| | | | | |
|---|---|---|---|---|
| 5,999,458 | A * | 12/1999 | Nishimura et al. ..... | 365/189.05 |
| 2001/0040829 | A1* | 11/2001 | Arimoto et al. ........ | 365/189.02 |
| 2005/0024984 | A1* | 2/2005 | Lee et al. ............... | 365/233 |
| 2006/0250883 | A1* | 11/2006 | Szczypinski ............ | 365/233 |

FOREIGN PATENT DOCUMENTS

| | | |
|---|---|---|
| JP | 01-291321 | 11/1989 |
| JP | 03-250497 | 11/1991 |
| JP | 06-036587 | 2/1994 |
| JP | 06-224746 | 8/1994 |
| JP | 08-180667 | 7/1996 |
| JP | 10-188553 | 7/1998 |
| JP | 2006-139879 | 6/2006 |
| JP | 2007-102936 | 4/2007 |

OTHER PUBLICATIONS

Song et al., "A 1.2 Gb/s/pin Double Data Rate SDRAM with On-Die-Termination," 2003 IEEE Int'l Solid-State Circuits Conference, Session 17, Paper 17.8 (2003).
Japanese Patent Office issued a Japanese Office Action dated May 12, 2009, Application No. 2006-224575.

* cited by examiner

*Primary Examiner*—Dang T Nguyen
(74) *Attorney, Agent, or Firm*—Young & Thompson

(57) ABSTRACT

A latency counter includes: a point-shift type FIFO circuit having plural latch circuits connected in parallel, each latch circuit including an input gate and an output gate, and having an internal command MDRDT supplied in common to the input gates; and a selector that makes any one of the input gates and any one of the output gates conductive. The selector includes a counter that changes over between a selection operation of selecting the input gate and a selection operation of selecting the output gate, and the counter outputs a count value in a binary format synchronously with an internal clock ICLK. Because the binary-format counter is used in this way, the count value itself does not cause an error.

8 Claims, 9 Drawing Sheets

LATENCY COUNTER

TECHNICAL FIELD

The present invention relates to a latency counter. Particularly, the present invention relates to a latency counter that counts latencies of an internal command within a synchronous memory. The present invention also relates to a data processing system that includes a semiconductor memory device having a latency counter.

BACKGROUND OF THE INVENTION

A synchronous memory as represented by a synchronous DRAM (Synchronous Dynamic Random Access Memory) is widely used for a main memory of a personal computer or the like. The synchronous memory inputs and outputs data synchronously with a clock signal supplied from a memory controller. Therefore, a data transfer rate can be increased by using a higher clock.

However, in the synchronous DRAM, because a DRAM core steadily carries out an analog operation, an extremely weak charge needs to be amplified using a sense operation. Accordingly, a time from when a read command is issued until when the first data is output cannot be shortened. The first data is output synchronously with an external clock after a lapse of a predetermined delay time since the read command is issued.

This delay time is generally called "CAS latency", and is set to an integer times a clock cycle. For example, when the CAS latency is five (CL=5), the first data is output synchronously with the external clock after five cycles, after fetching the read command synchronously with the external clock. In other words, the first data is output after five clocks. A counter that counts these latencies is called "latency counter".

A circuit as described in Ho Young Song and 15 others, "A 1.2 Gb/s/pin Double Data Rate SDRAM with On-Die-Termination", ISSCC 2003/SESSION 17/SRAM AND DRAM/PAPER 17.8, (United States), IEEE, 2003, p. 314 is known as the latency counter. The latency counter described in this paper includes plural latch circuits that latch read commands, a switch that reads a read command from any one of the latch circuits, a first ring counter that selects a latch circuit of latching the read command by sequentially circulating the latch circuits, and a second ring counter that selects a latch circuit of reading the read command by sequentially circulating the latch circuits. With this arrangement, the latched read command can be output at a timing corresponding to a difference between a count value of the first ring counter and a count value of the second ring counter.

However, because the different ring counters are used for the input and for the output, the operations of the two ring counters cannot be easily synchronized when the frequency of the clock becomes high. It sometimes becomes impossible to simultaneously reset the two ring counters at the reset time. Therefore, the count values of the latencies are deviated, resulting in a malfunction.

SUMMARY OF THE INVENTION

In order to solve the above problems, the present inventors have proposed a method of sharing a ring counter for both the input and the output. According to this method, a value of the ring counter is used for the output value, and a value obtained by shifting the ring counter value by a predetermined value is used for the input value, thereby sharing the ring counter.

However, as a result of repeated investigations carried out by the inventors, it has become clear that the ring counter itself has a possibility of generating a malfunction. In other words, the ring counter has such a configuration that, among the plural latch circuits connected in circulation, an active level (for example, a high level) is latched to any one latch circuit, and the latch circuit to which the active level is latched is circularly shifted. However, at the time of entering a self-refresh mode or a power-down mode, a hazard is sometimes output to the internal clock at some timing, thereby making the ring counter in an unsteady state.

When the ring counter becomes in the unsteady state, an error occurs that the active level is latched to plural latch circuits or a non-active level is latched to all latch circuits. This error cannot be removed until when the whole memories are restarted. Therefore, the latency counter cannot carry out a normal operation any more.

The present invention has been achieved to solve the above problems. Therefore, it is an object of the present invention to provide an improved latency counter.

It is another object of the present invention to provide a latency counter that can be automatically recovered without requiring a restarting, even when the counter temporarily becomes in the unsteady state.

The above and other objects of the present invention can be accomplished by a latency counter that counts latencies of an internal command synchronously with an internal clock, the latency counter comprising:

a point-shift type FIFO circuit having a plurality of latch circuits connected in parallel, each latch circuit including an input gate and an output gate, and the internal command being supplied in common to the input gates; and a selector that selects any one of the input gates and selects any one of the output gates, the selector including a counter that changes a selection operation of selecting the input and output gates, the counter outputs a count value in a binary format synchronously with the internal clock.

The kind of the counter is not particularly limited when the counter can output a count value in a binary format. For example, a ripple counter can be used. The use of the ripple counter has a problem in that a change is delayed in a higher bit, at the time of carrying out an increment or a decrement. However, this problem can be solved by using a unit such as a delay circuit that matches the change timing of each bit.

In this case, the output of the counter is delayed from the internal clock. However, this delay can be corrected by using a timing correcting circuit that fetches the output of a point-shift type FIFO circuit in synchronism with the internal clock. When the delay is relatively large, the timing correcting circuit can be configured by using plural latch circuits connected in cascade. Specifically, out of the plural latch circuits constituting the timing correcting circuit, at least the first-stage latch circuit is operated synchronously with the delay clock obtained by delaying the internal clock, and at least the last-stage latch circuit is operated synchronously with the internal clock. With this arrangement, the correction can be completed securely.

As explained above, according to the present invention, the counter that outputs the count value in the binary format is used for the counter that controls the selection operation carried out by the selector. Therefore, the fact that the count value causes an error can be avoided. In other words, while the ring counter requires that the active level be latched to only one latch circuit and the other states are error statuses, the counter that outputs the count value in the binary format does not have such a constraint.

Accordingly, even when the counter temporarily becomes in the unsteady state and when the count value of the counter changes as a result, the latency count operation is not affected at all. In other words, because the counter is automatically recovered from the unsteady state, the counter can continue the normal operation without requiring a restart operation.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
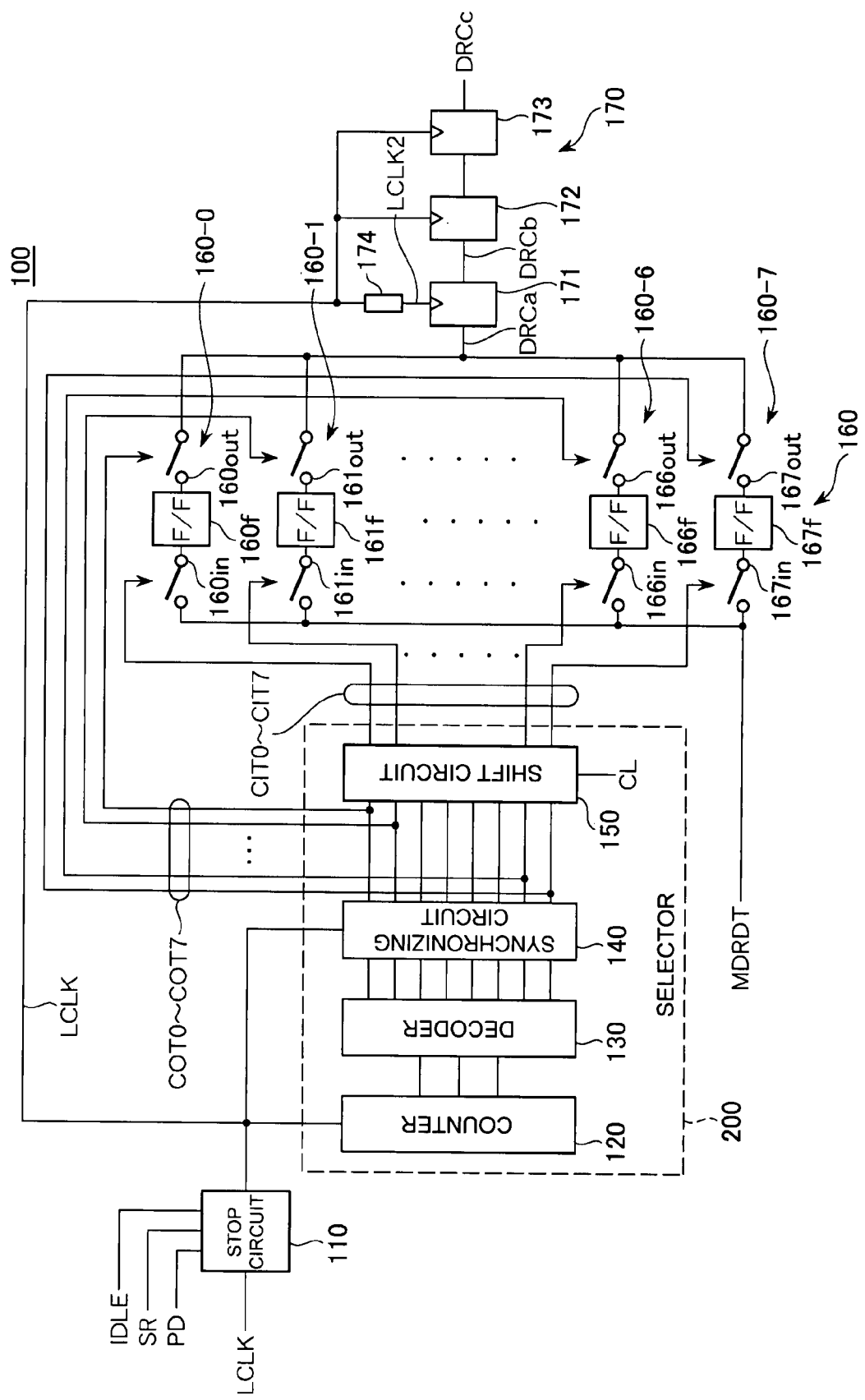
FIG. 1 is a circuit diagram of a latency counter according to a preferred embodiment of the present invention.

FIG. 1 is a circuit diagram of a latency counter 100 according to a preferred embodiment of the present invention.

The latency counter 100 according to the present embodiment is a so-called CL counter that counts CAS latencies of the read command during the read operation. However, the application of the present invention is not limited to this area.

As shown in FIG. 1, the latency counter 100 according to the present embodiment includes a point-shift type FIFO circuit 160 including plural latch circuits connected in parallel, and a selector 200 that controls the operation of this point-shift type FIFO circuit 160. The selector 200 includes a counter 120 that increments (or decrements) the count value in synchronism with an internal clock LCLK, a decoder 130 that decodes the count value of the counter 120, a synchronizing circuit 140 that synchronizes the output of the decoder 130 with the internal clock LCLK, and a shift circuit 150 that shifts the output of the synchronizing circuit 140.

The internal clock LCLK is a clock signal that is generated by a DLL (Delay Locked Loop) circuit (not shown) In order to decrease power consumption during the self-refresh mode or during the power-down mode, a stop circuit 110 interrupts the internal clock LCLK supplied to the latency counter 100.

Figure 2:
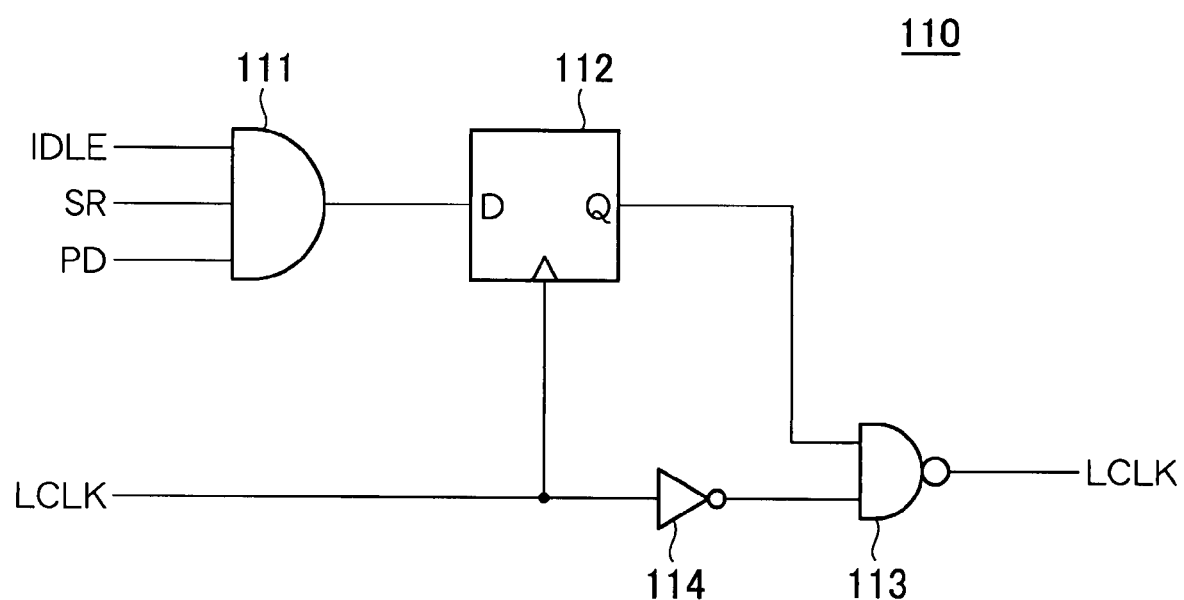
FIG. 2 is a circuit diagram of the stop circuit shown in FIG. 1.

FIG. 2 is a circuit diagram of the stop circuit 110.

As shown in FIG. 2, the stop circuit 110 includes an AND circuit 111 that receives an idle signal IDLE, a self-refresh signal SR, and a power-down signal PD, and a latch circuit 112 that fetches the output of the AND circuit 111 in synchronism with the internal clock LCLK. The idle signal IDLE, the self-refresh signal SR, and the power-down signal PD all maintain a high level during the normal operation mode. Therefore, the output of the latch circuit 112 is also maintained at the high level during the normal operation mode.

The output of the latch circuit 112 is supplied to one of input terminals of a NAND circuit 113. A signal obtained by inverting the internal clock LCLK by an inverter 114 is supplied to the other input terminal of the NAND circuit 113. Therefore, during the normal operation, the stop circuit 110 passes the internal clock LCLK.

On the other hand, when at least one of the idle signal IDLE, the self-refresh signal SR, and the power-down signal PD becomes at a low level, that is, when the latency counter 100 enters any one of the idle state, the self-refresh mode, and the power-down mode, the low level is fetched into the latch circuit 112. As a result, the NAND circuit 113 interrupts the internal clock LCLK.

The internal clock LCLK that has passed the stop circuit 110 is supplied to the counter 120 and the synchronizing circuit 140 shown in FIG. 1.

Figure 3:
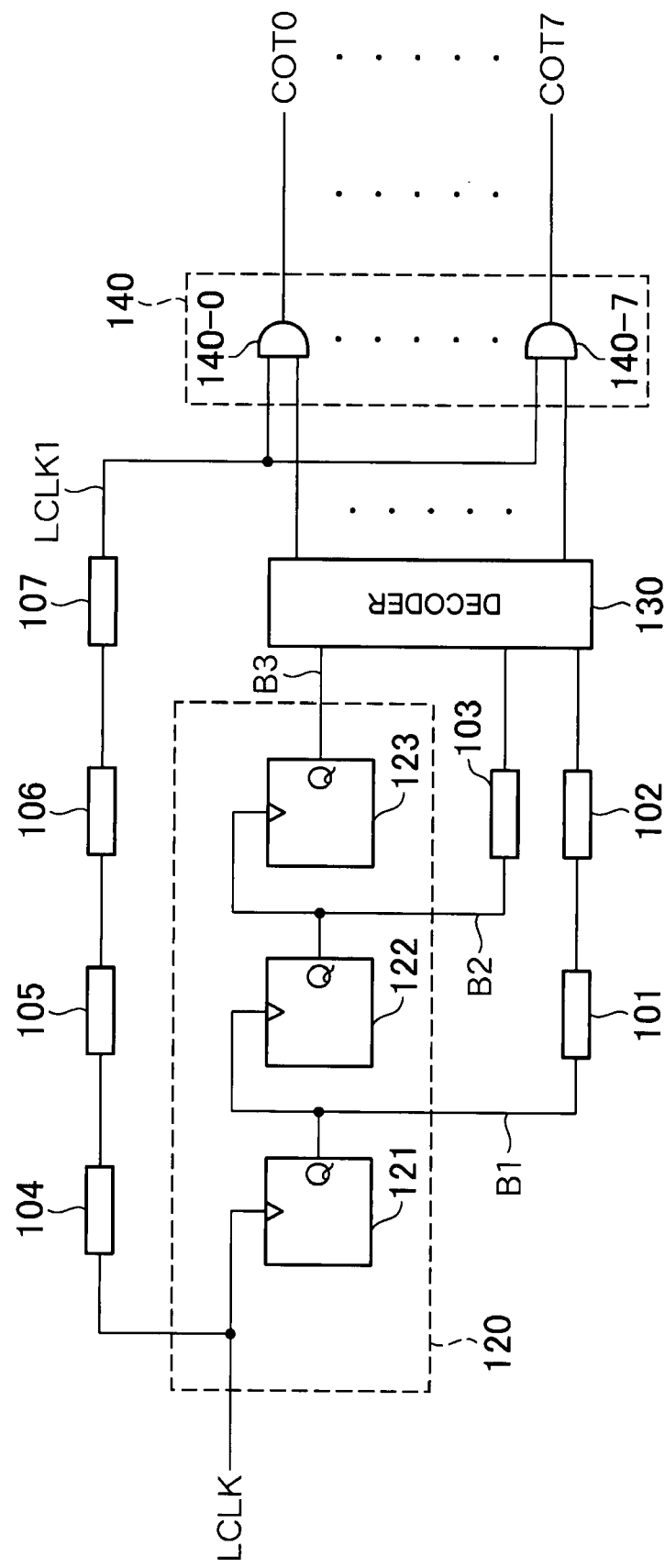
FIG. 3 is a circuit diagram of the counter, the decoder, and the synchronizing circuit shown in FIG. 1.
Figure 4:
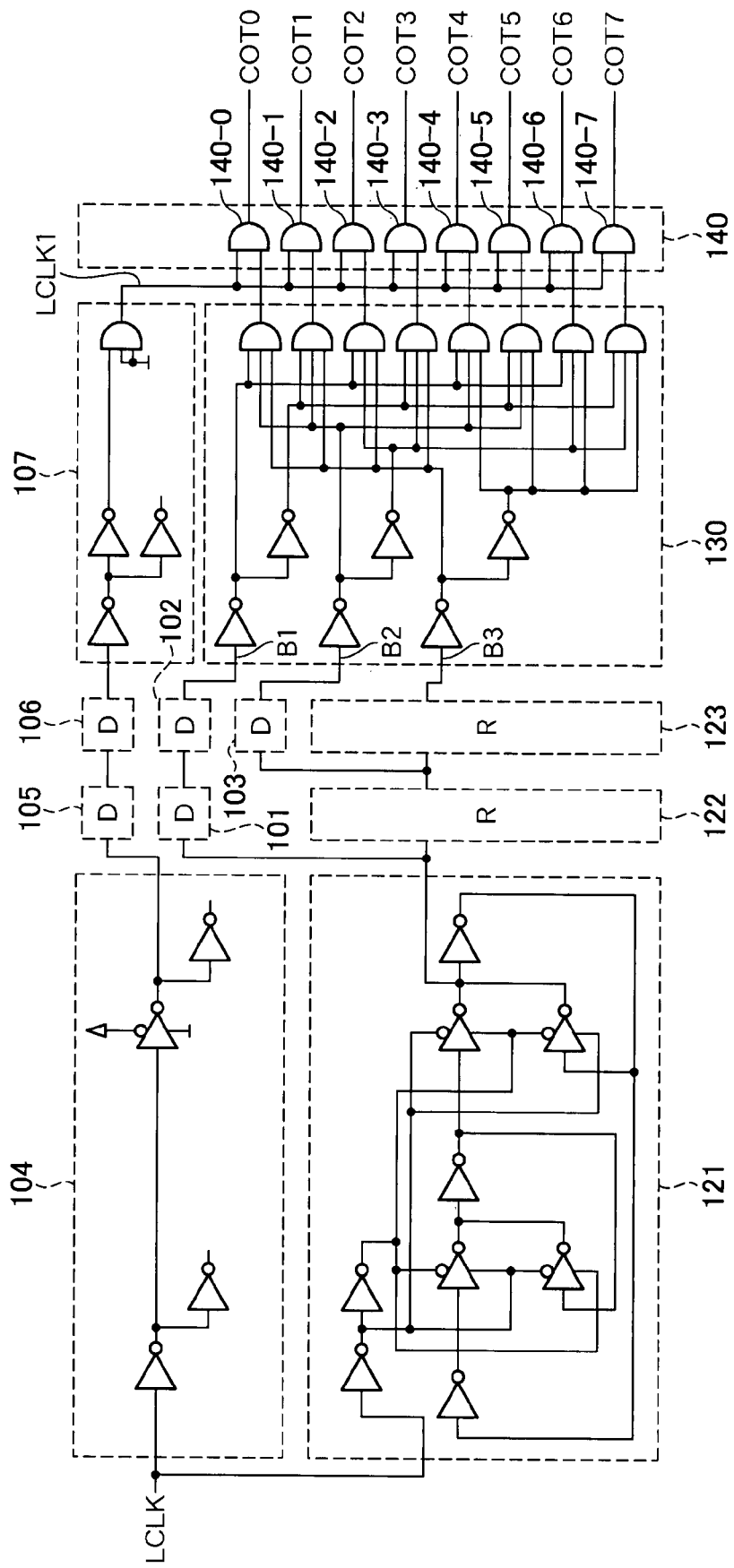
FIG. 4 is a diagram showing a more detailed circuit configuration of the counter, the decoder, and the synchronizing circuit shown in FIG. 1.

FIG. 3 is a circuit diagram of the counter 120, the decoder 130, and the synchronizing circuit 140. FIG. 4 is a diagram showing a further detailed circuit configuration of the counter 120, the decoder 130, and the synchronizing circuit 140.

As shown in FIG. 3, the counter 120 is a three-bit ripple counter having ripple-type flip-flops 121 to 123 connected in cascade. The internal clock LCLK is supplied to the clock terminal of the flip-flop 121. Therefore, an output bit B1 of the flip-flop 121 shows the lowest bit of the binary signal. An output bit B2 of the flip-flop 122 is the second bit of the binary signal, and an output bit B3 of the flip-flop 123 is the highest bit of the binary signal. A detailed circuit configuration of the flip-fop 121 is as shown in FIG. 4. The flip-flop 121 inverts the held value in response to a change of the internal clock LCLK from the low level to the high level.

The output bits B1 to B3 of the flip-flops 121 to 123 are supplied to the decoder 130. However, the output bits B1 to B3 do not change at the same timing, but sequentially change from the lowest bit. In other words, the change of the higher bit is more delayed. In the present embodiment, delay circuits 101 to 103 are used to avoid a difference between the change timings. Each of these delay circuits 101 to 103 has a delay amount corresponding to one stage of the flip-flop.

As shown in FIG. 3 and FIG. 4, the delay circuits 101 and 102 are connected in series between the flip-flop 121 and the decoder 130. Therefore, the output bit B1 of the flip-flop 121 is input to the decoder 130 after the output bit B1 is given a delay of two stages of the flip-flop. The delay circuit 103 is connected to between the flip-flop 122 and the decoder 130. Accordingly, the output bit B2 of the flip-flop 122 is input to the decoder 130 after the output bit B2 is given a delay of one stage of the flip-flop.

Consequently, the change timings of the bits B1 to B3 that are input to the decoder 130 substantially coincide with each other. The decoder 130 activates any one of eight ($=2^3$) outputs to the high level, based on the bits B1 to B3 in the binary format. A detailed circuit configuration of the decoder 130 is as shown in FIG. 4.

The synchronizing circuit 140 that receives the output of the decoder 130 includes eight AND circuits 140-0 to 140-7 corresponding to the outputs of the decoder 130. A delay clock LCLK1 provided by having the internal clock delayed by the delay circuits 104 to 107 is connected in common to the AND circuits 140-0 to 140-7.

The delay circuits 104 to 106 have the same circuit configurations as those of the delay circuits 101 to 103, and each of these delay circuits 104 to 106 has a delay amount corresponding to one stage of the flip-flop. On the other hand, the delay circuit 107 has a delay amount corresponding to the operation time of the decoder 130. Specifically, the delay circuit 107 has the circuit configuration as shown in FIG. 4. Therefore, the delay amount of the delay clock LCLK1 corresponding to the internal clock LCLK corresponds to the sum of the delay time of the counter 120 and the delay time of the decoder 130.

Accordingly, there is substantially no skew between the output of the decoder 130 and the delay clock LCLK1, and a sufficient operation margin can be secured. The output of the synchronizing circuit 140 is used for output gate control signals COT0 to COT7.

The output gate control signals COT0 to COT7 are supplied to the shift circuit 150 shown in FIG. 1. The shift circuit 150 generates input gate control signals CIT0 to CIT7 based on the output gate control signals COT0 to COT7.

Figure 5:
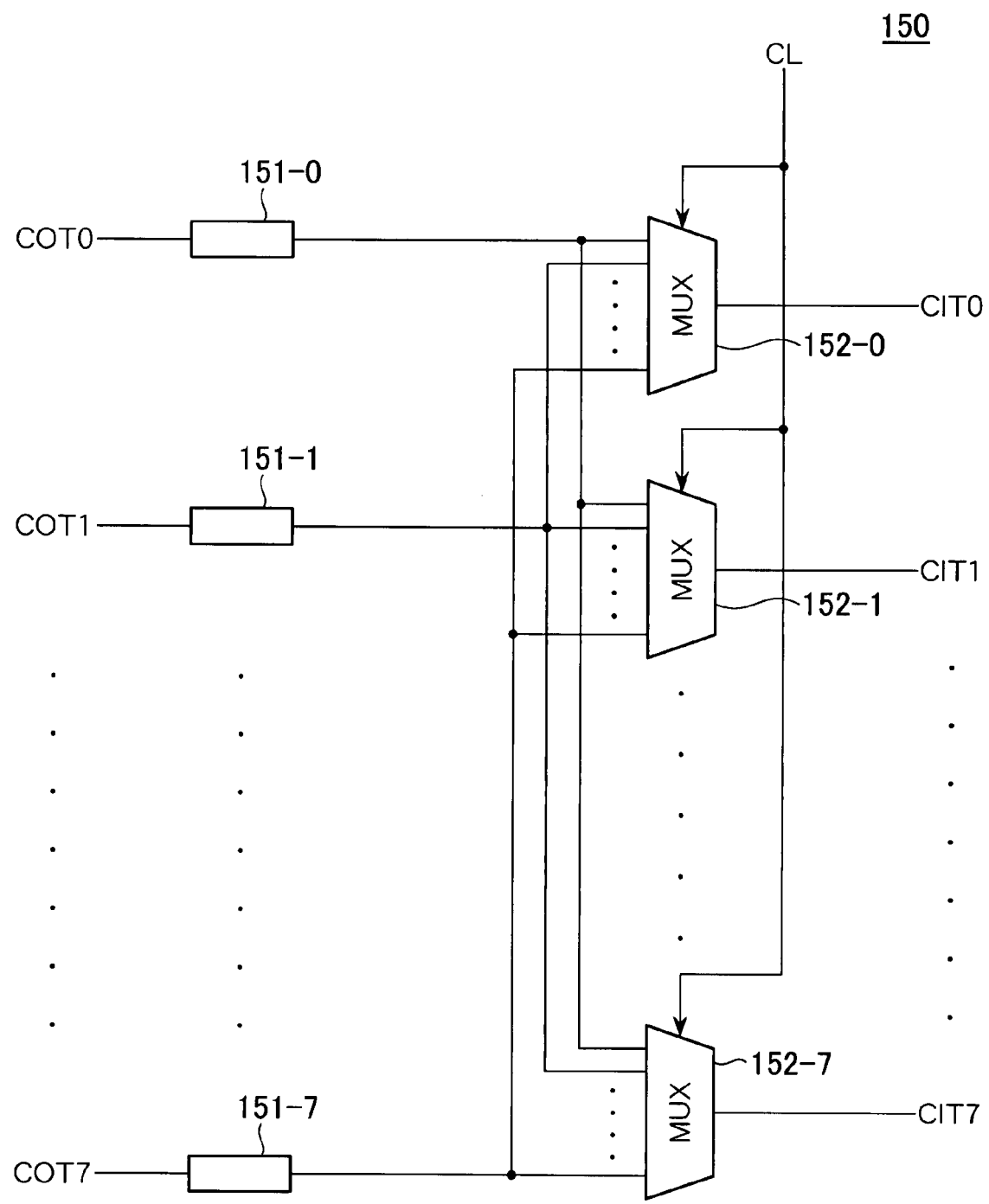
FIG. 5 is a circuit diagram of the shift circuit shown in FIG. 1.

FIG. 5 is a circuit diagram of the shift circuit 150.

As shown in FIG. 5, the shift circuit 150 includes delay circuits 151-0 to 151-7 that delay the output gate control signals COT0 to COT7, respectively, and multiplexers 152-0 to 152-7 that receive the outputs of the delay circuits 151-0 to 151-7, respectively.

The delay circuits 151-0 to 151-7 are circuits that offset timing differences of the output gate control signals COT0 to COT7 synchronous with the internal clock LCLK, to synchronize these output gate control signals COT0 to COT7 with the external clock (CK). The multiplexers 152-0 to 152-7 are circuits that activate the input gate control signals CIT0 to CIT7 as the outputs to the high level when a predetermined one of the output gate control signals COT0 to COT7 becomes at the high level.

When which one of the output gate control signals COT0 to COT7 becomes at the high level the input gate control signals CIT0 to CIT7 should be set to the high level is determined for each of the multiplexers 152-0 to 152-7. This assignment is carried out based on a latency setting signal CL.

Figure 6A:
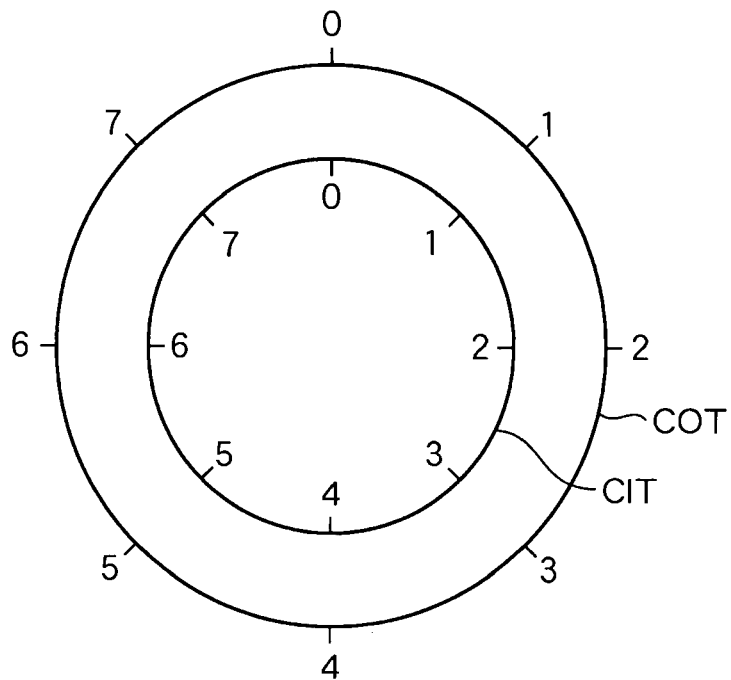
FIGS. 6A and 6B are schematic diagrams for explaining the function of the shift circuit shown in FIG. 5.
Figure 6B:
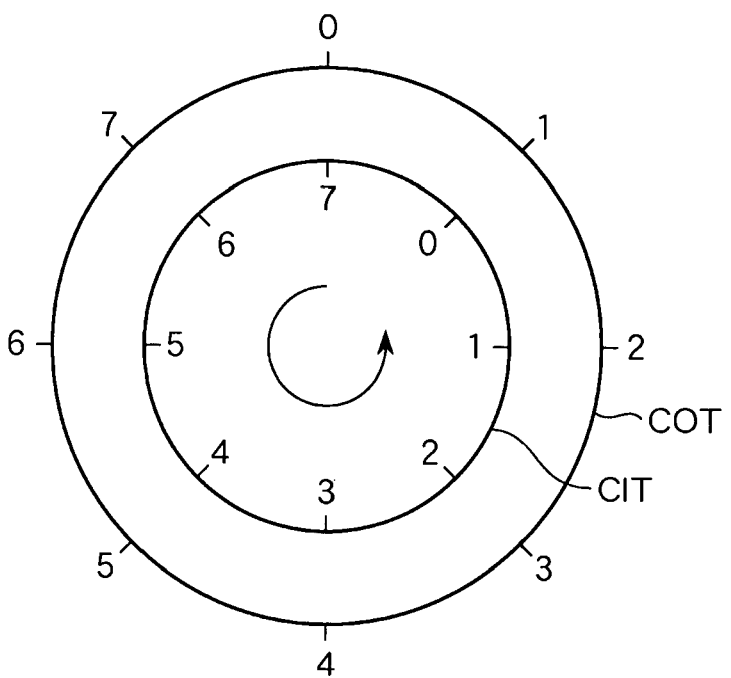

FIGS. 6A and 6B are schematic diagrams for explaining the function of the shift circuit 150.

In FIGS. 6A and 6B, a ring COT at the external side corresponds to the output gate control signals, and a ring CIT at the internal side corresponds to the input gate control signals. Signals at the corresponding scales of the rings COT and CIT indicate the corresponding signals.

This is explained in further detail. FIG. 6A is an example that a difference between the output gate control signals COT0 to COT7 and the input gate control signals CIT0 to CIT7 is set to "0". In this case, when the output gate control signal COT0 becomes at the high level, the corresponding input gate control signal CIT0 becomes at the high level. When the output gate control signal COT1 becomes at the high level, the corresponding input gate control signal CIT1 becomes at the high level. In other words, when an output gate control signal COTk (where k represents an integer of 0 to 7) corresponds to an input gate control signal CITj (where j represents an integer of 0 to 7), this shows a state of j=k.

On the other hand, FIG. 6B is an example that a difference between the output gate control signals COT0 to COT7 and the input gate control signals CIT0 to CIT7 is set to "7". This depicts an image that the ring CIT at the internal side is turned to the left by seven scales. In this case, when the output gate control signal COT0 becomes at the high level, the corresponding input gate control signal CIT7 becomes at the high level. When the output gate control signal COT1 becomes at the high level, the corresponding input gate control signal CIT0 becomes at the high level. In other words, this shows a state of j−k=7 or j−k=−1.

The difference can be optionally set to a value from 0 to 7. In the state that the difference is set, a correspondence relationship between the output gate control signal and the input gate control signal is fixed. In this way, the shift circuit shifts the output gate control signals COT0 to COT7 to generate the input gate control signals CIT0 to CIT7.

The selector 200 generates the output control signals COT0 to COT7 and the input gate control signals CIT0 to CIT7 in the manner as described above. The generated control signals are supplied to the point-shift type FIFO circuit 160 shown in FIG. 1.

The point-shift type FIFO circuit 160 includes eight latch circuits 160-0 to 160-7. The latch circuits 160-0 to 160-7 include flip-flops 160f to 167f, input gates 160in to 167in that are provided corresponding to these flip-flops, and output gates 160out to 167out. The input gate control signals CIT0 to CIT7 as the outputs of the shift circuit 150 are supplied to the input gates 160in to 167in, respectively. The output gate control signals COT0 to COT7 as the outputs of the synchronizing circuit 140 are supplied to the output gates 160out to 167out, respectively.

Figure 7:
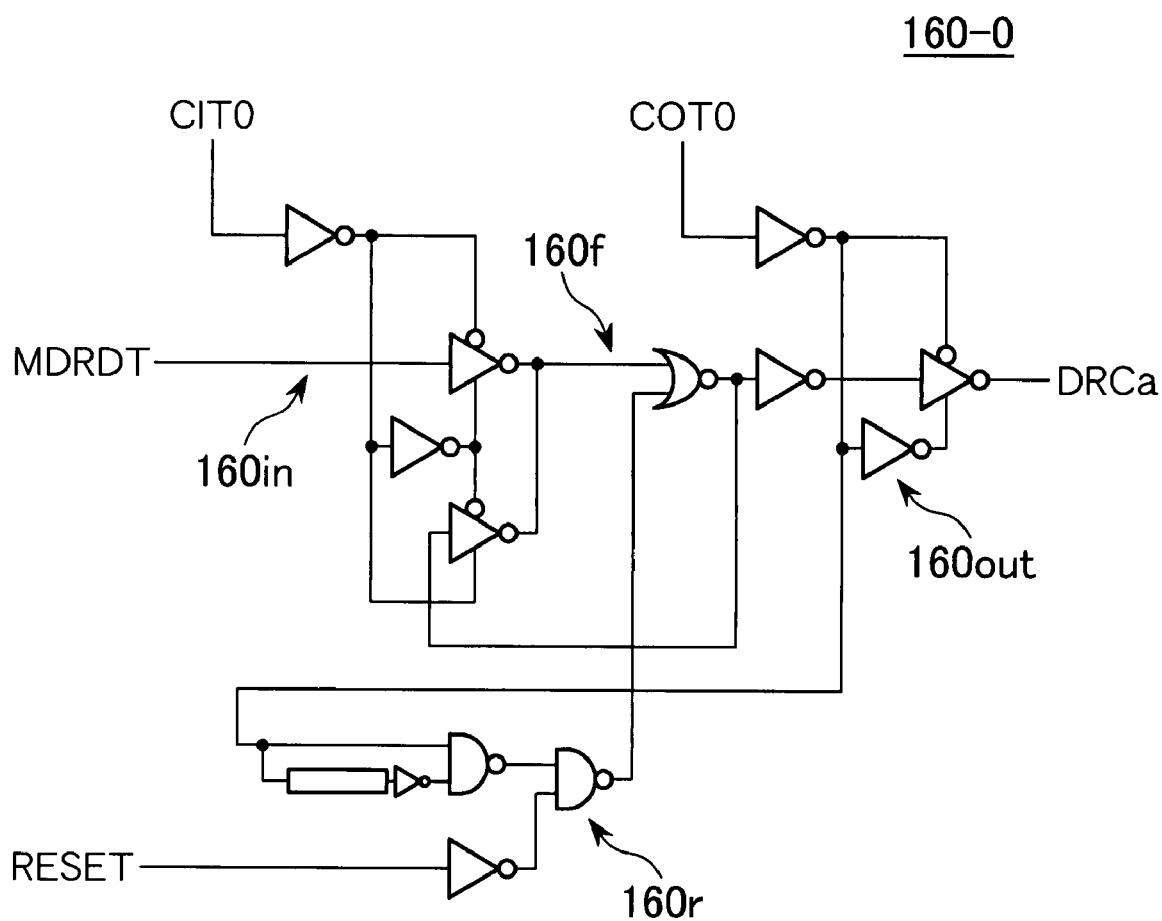
FIG. 7 is a circuit diagram of the latch circuit shown in FIG. 1.

FIG. 7 is a circuit diagram of the latch circuit 160-0.

As shown in FIG. 7, when the input gate control signal CIT0 becomes at the high level, the input gate 160in of the latch circuit 160-0 is opened, and the latch circuit 160-0 fetches a read command MDRDT. The flip-flop 160f holds the fetched read command MDRDT. When the output gate control signal COT0 becomes at the high level, the output gate 160out is opened, and the latch circuit 160-0 outputs the fetched read command MDRDT.

The latch circuit 160-0 is provided with a reset circuit 160r. The reset circuit 160r erases the read command MDRDT held in the flip-flop 160f in response to a change of the output gate control signal COT0 from the high level to the low level. When a reset signal RESET becomes at the high level, the reset circuit 160r compulsively erases the read command MDRDT held in the flip-flop 160f.

The other latch circuits 160-1 to 16-7 also have the same circuit configurations as that of the latch circuit 160-0 shown in FIG. 7, except that the input gate control signals CIT1 to CIT7 and the output gate control signals COT1 to COT7 are supplied to the latch circuits 160-0 to 160-7, respectively. The outputs of the latch circuits 160-0 to 160-7 are connected in common, and are used as a read command DRCa.

Referring back to FIG. 1, the latency counter 100 according to the present embodiment further includes a timing correcting circuit 170 connected at the latter stage of the point-shift type FIFO circuit 160.

The timing correcting circuit 170 has a configuration having latch circuits 171 to 173 connected in cascade. A delay clock LCLK2 provided by having the internal clock LCLK delayed by a delay circuit 174 is connected to the first-stage latch circuit 171 as the timing signal. On the other hand, the internal clock LCLK is connected directly as a timing signal to the latter-stage latch circuits 172 and 173.

This is because, as a result of using the delay circuits 101 to 107 within the selector 200, the read command DRCa as the output of the point-shift type FIFO circuit 160 has a predetermined delay from the internal clock LCLK. In order to control the read data, the read command DRCa needs to be synchronized with the internal clock LCLK. To achieve this, the timing correcting circuit 170 is used.

In the present embodiment, the first-stage latch circuit 171 generates a read command DRCb having a decreased delay from the internal clock LCLK. Further, the latter-stage latch circuits 172 and 173 generate a read command DRCc completely synchronous-with the internal clock LCLK. When a single latch circuit is used to avoid a delay from the internal clock LCLK, this has a risk of shortage of the latch margin. Therefore, the plural latch circuits 171 to 173 are used to avoid this risk. Consequently, when the delay from the internal clock LCLK is small, the use of the plural latch circuits is not always necessary.

The configuration of the latency counter 100 according to the present embodiment is as explained above. The operation of the latency counter 100 according to the present embodiment is explained next.

Figure 8:
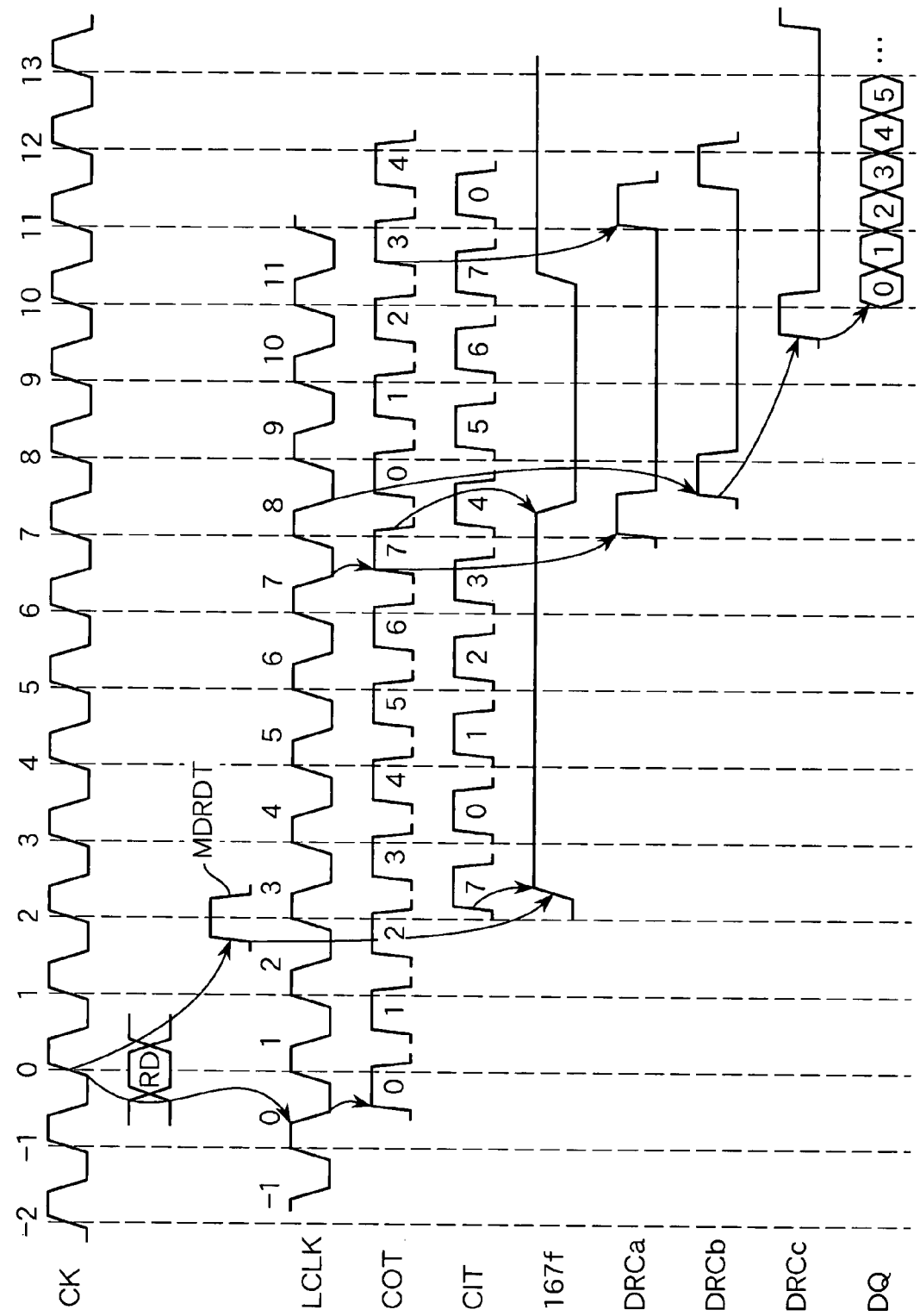
FIG. 8 is a timing chart for explaining the operation of the latency counter shown in FIG. 1.

FIG. 8 is a timing chart for explaining the operation of the latency counter 100 according to the present embodiment.

FIG. 8 is an example that a read command RD is issued synchronously with an edge 0 of an external clock CK. As shown in FIG. 8, it takes a predetermined time from when the read command RD is issued until when an internal read command MDRDT is generated. The read command MDRDT is held in any one of the eight flip-flops 160f to 167f that constitute the point-shift type FIFO circuit 160, based on the output of the shift circuit 150. The present example shows a state that the input gate control signal CIT7 is selected at the timing when the read command MDRDT is generated. Therefore, in this case, the read command MDRDT is stored in the flip-fop 167f.

The read command MDRDT stored in the flip-flop 167f is held in the flip-flop 167f until when the output gate control signal COT7 is selected at an increment of the counter 120. When the output gate control signal COT7 is selected, the read command DRCa as the output of the point-shift type FIFO circuit 160 is activated. Thereafter, the read command DRCa proceeds to the latch circuits 171 to 173 synchronously with the internal clock LCLK, and is output from the last-stage latch circuit 173 as the read command DRCc.

The read command DRCc is synchronous with the internal clock LCLK. Read data DQ is actually output using this reach command DRCc.

Thereafter, when the operation enters the self-refresh mode or the power-down mode, the stop circuit 110 shown in FIG. 1 interrupts the internal clock LCLK. As a result, the latency counter 100 stops the operation. At this time, a hazard is sometimes output to the internal clock LCLK depending on the timing. This results in an unsteady state of the counter 120 in some cases.

However, the latency counter 100 according to the present embodiment has no meaning in the counter value itself, and does not generate any problem at all when the increment (or the decrement) is correctly carried out during the normal operation. In other words, the count value itself does not cause an error. Even when the count value changes due to the unsteady state of the counter 120, the latency counter 100 can continuously execute the next operation.

As explained above, according to the latency counter 100 of the present embodiment, the error attributable to the hazard of the internal clock LCLK can be prevented.

Further, because the read command MDRDT is kept held in one of the flip-flops within the point-shift type FIFO circuit 160 during the counting of the latencies, a sufficient time margin can be secured to shift the read command to be synchronized with from the external clock CK to the internal clock LCLK.

As explained above, according to the present invention, the counter that outputs the count value in the binary format is used for the counter that controls the selection operation carried out by the selector. Therefore, the fact that the count value causes an error can be avoided. In other words, while the ring counter requires that the active level be latched to only one latch circuit and the other states are error statuses, the counter that outputs the count value in the binary format does not have such a constraint.

Accordingly, even when the counter temporarily becomes in the unsteady state and when the count value of the counter changes as a result, the latency count operation is not affected at all. In other words, because the counter is automatically recovered from the unsteady state, the counter can continue the normal operation without requiring a restart operation.

The present invention can preferably apply to the semiconductor memory device, especially a DRAM.

Figure 9:
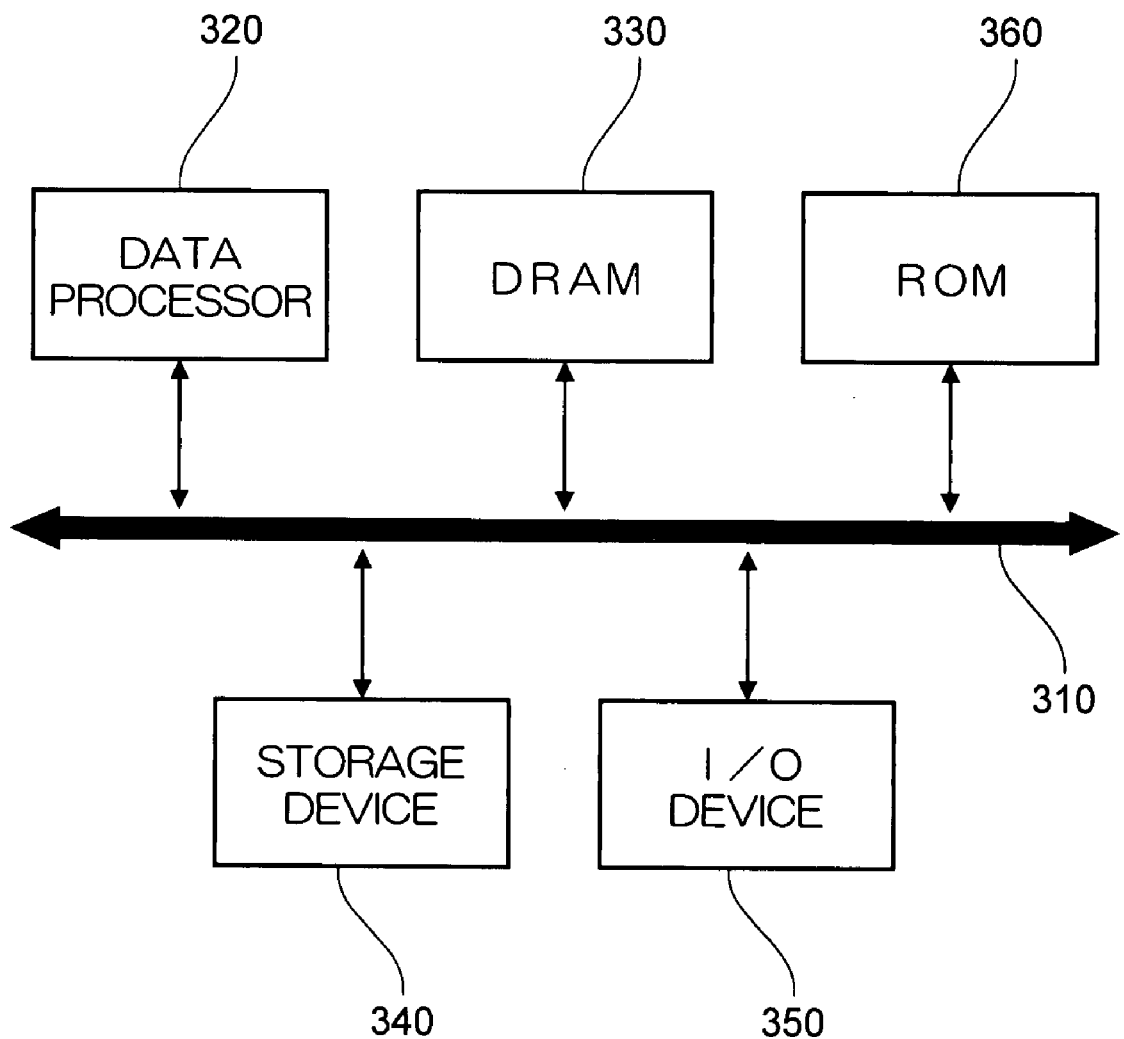
FIG. 9 is a block diagram showing a data processing system using the DRAM that the present invention is applied.

FIG. 9 is a block diagram showing a data processing system using the DRAM that the present invention is applied.

The data processing system 300 shown in FIG. 9 includes a data processor 320 and a DRAM 330 that the present invention is applied are connected to each other via a system bus 310. The data processor 320 can be selected from at least a microprocessor (MPU) and a digital signal processor (DSP). In FIG. 9, although the data processor 320 and the DRAM 330 are connected via the system bus 310 in order to simplify the diagram, they can be connected via not the system bus 310 but a local bus.

Further, in FIG. 9, although only one set of system bus 310 is employed in the data processing system 300 in order to simplify the diagram, a serial bus or a parallel bus connected to the system bus 310 via connectors can be provided. As shown in FIG. 9, a storage device 340, an I/O device 350, and a ROM 360 are connected to the system bus 310. However, they are not essential element for the data processing system 300.

The storage device 340 can be selected from at least a hard disk drive, an optical disk drive, and flash memory device. The I/O device 350 can be selected from a display device such as a liquid crystal display (LCD) and an input device such as a key board or a mouse. The I/O device 350 can consists of either input or output device. Further, although each one element is provided as shown in FIG. 9, two or more same elements can be provided in the data processing system.

The present invention is in no way limited to the aforementioned embodiments, but rather various modifications are possible within the scope of the invention as recited in the claims, and naturally these modifications are included within the scope of the invention.

What is claimed is:

1. A latency counter that counts latencies of an internal command synchronously with an internal clock, the latency counter comprising:

a point-shift type FIFO circuit having a plurality of latch circuits connected in parallel, each latch circuit including an input gate and an output gate, and the internal command being supplied in common to the input gates; and a selector that selects any one of the input gates and selects any one of the output gates, the selector including, a counter that changes a selection operation of selecting the input and output gates and that outputs a count value in a binary format synchronously with the internal clock, a decoder that decodes the count value in the binary format, and assigns one of the input gate and the output gate to be selected, based on the output value of the decoder, and a synchronizing circuit that supplies the output of the decoder to the point-shift type FIFO circuit synchronously with a first delay clock obtained by delaying the internal clock, wherein a delay amount of the first delay clock from the internal clock corresponds to the sum of a delay time of the counter and a delay time of the decoder.

2. The latency counter as claimed in claim 1, wherein the counter includes adjusting circuit that matches change timings of a plurality of bits that constitutes the count value.

3. The latency counter as claimed in claim 2, wherein the counter is a ripple counter, and the adjusting circuit is a delay circuit.

4. The latency counter as claimed in claim 1, wherein the selector further includes a shift circuit that assigns the other of the input gate and the output gate to be selected, based on a predetermined relationship between the input gates and the output gates.

5. The latency counter as claimed in claim 4, wherein the shift circuit can change the predetermined relationship between the input gates and the output gates based on a set signal.

6. The latency counter as claimed in claim 1, further comprising a timing correcting circuit that is coupled in common to the output gates and that fetches the output of the point-shift type FIFO circuit synchronously with the internal clock.

7. The latency counter as claimed in claim 6, wherein the timing correcting circuit includes a plurality of latch circuits connected in series, and out of the plurality of latch circuits included in the timing correcting circuit, at least the first-stage latch circuit operates synchronously with a second delay clock obtained by delaying the internal clock, and at least the last-stage latch circuit operates synchronously with the internal clock.

8. A data processing system comprising a data processor and a semiconductor memory device including a latency counter that counts latencies of an internal command synchronously with an internal clock, wherein the latency counter including:
 a point-shift type FIFO circuit having a plurality of latch circuits connected in parallel, each latch circuit including an input gate and an output gate, and the internal command being supplied in common to the input gates; and
 a selector that selects any one of the input gates and selects any one of the output gates,
 the selector including,
  a counter that changes a selection operation of selecting the input and output gates and that outputs a count value in a binary format synchronously with the internal clock,
  a decoder that decodes the count value in the binary format, and assigns one of the input gate and the output gate to be selected, based on the output value of the decoder, and
  a synchronizing circuit that supplies the output of the decoder to the point-shift type FIFO circuit synchronously with a first delay clock obtained by delaying the internal clock, wherein a delay amount of the first delay clock from the internal clock corresponds to the sum of a delay time of the counter and a delay time of the decoder.

* * * * *